United States Patent
Carbou et al.

[11] Patent Number: 6,160,507
[45] Date of Patent: Dec. 12, 2000

[54] CURRENT BIT CELL AND SWITCHED CURRENT NETWORK FORMED OF SUCH CELLS

[75] Inventors: Pierre Carbou, Tourrettes-sur-loup; Pascal Guignon, Fayence, both of France

[73] Assignee: Texas Instruments Incorporated, Dallas, Tex.

[21] Appl. No.: 09/189,073

[22] Filed: Nov. 9, 1998

[30] Foreign Application Priority Data

May 13, 1996 [FR] France ................... 97 401063

[51] Int. Cl.[7] ........................................ H03M 1/66
[52] U.S. Cl. ........................................ 341/144; 341/136
[58] Field of Search ........................... 341/144, 136, 341/148, 81; 365/201, 185.29, 185.24, 185.21, 185.22, 195, 230.06, 230.03; 327/227

[56] References Cited

U.S. PATENT DOCUMENTS

| | | | |
|---|---|---|---|
| 4,393,370 | 7/1983 | Hareyama | 341/148 |
| 4,490,634 | 12/1984 | Hareyama | 341/81 |
| 5,105,193 | 4/1992 | Vogt et al. | 341/136 |
| 5,148,065 | 9/1992 | Krenik et al. | 341/118 |
| 5,331,322 | 7/1994 | Cha et al. | 341/136 |
| 5,361,233 | 11/1994 | Kotani | 365/207 |
| 5,369,402 | 11/1994 | Kwon | 341/136 |
| 5,463,394 | 10/1995 | Sun | 341/136 |

FOREIGN PATENT DOCUMENTS 0 136 229 A2  3/1985  European Pat. Off. ......... H03K 5/24

OTHER PUBLICATIONS

IBM Technical Disclosure Bulletin, vol. 34, No. 10A, Mar. 1, 1992, New York, US, pp. 184–185, XP000302269 "Combined Sense Decoder and Amplifier" *p. 184, line 1–line 14; figure 1*.

Primary Examiner—Michael Tokar
Assistant Examiner—Jean B. Jeanglaude
Attorney, Agent, or Firm—William B. Kempler; Frederick J. Telecky, Jr.

[57] ABSTRACT

Current bit cell having a current source (P1), a transistor (P6) for detecting the presence of a digital signal bit (Bit) and a plurality of transistors (P2, P5, P7) for detecting at least one command signal (L, Lc) so as to command, on a first output (S1) of the cell, the appearance of a current delivered by the current source (P1) as a function of the digital signal (Bit) applied to the cell and of the at least one command signal (L, Lc), a transistor (P9) for detecting the presence of a bit (Bitz) complementary to the bit of the digital signal (Bit) and a plurality of transistors (P3, P4, P8) for detecting the complement (Lz, Lcz) of the at least one command signal (L, Lc), so as to command on a second output (S2) of the cell the appearance of a current delivered by the current source (P1) which is the complement of the current delivered on the first output (S1), the transistors for detecting the presence of bits and of the at least one command signal, the transistors for detecting the presence of complementary bits and of complementary command signals and the current source being embodied with the aid of field-effect transistors of the same type.

10 Claims, 3 Drawing Sheets

CURRENT BIT CELL AND SWITCHED CURRENT NETWORK FORMED OF SUCH CELLS

BACKGROUND OF THE INVENTION

The present invention relates to the structure of a current bit cell intended to be used in switched current networks as, for example, in the implementation of analogue/digital converters ADCs.

The benefit of this structure resides in its capacity to produce networks of current bit cells with high density, a single type of device, and a decoding scheme allowing techniques to be applied which ensure the production of a monotonic device which minimises the matching errors.

Another advantage of this structure is the symmetry of its topology, which makes it suitable for the implementation of differential networks whose characteristics, connected with the unsusceptibility to noise, are attractive for the implementation of analogue circuits.

One known means of ensuring monotonicity, for example in a digital/analogue converter, is to add an element to each increment of a digital code.

Furthermore, it is also well known that the use of a "centroid" topology allows first-order minimisation of the errors resulting from matching gradients in integrated-circuit technology.

The use of the two techniques mentioned above requires a highly complex decoding scheme for each individual current bit cell.

It furthermore requires the use of N-type and P-type transistors, which means that the packing density of the cell cannot be optimised because of the need for two different types of substrate.

It furthermore has an asymmetric decoding structure which makes the cell inappropriate for differential networks.

The object of the invention is to overcome the aforementioned drawbacks of known current bit cell structures.

Its subject is therefore a current bit cell comprising a current source, means for detecting the presence of a digital signal bit and means for detecting at least one command signal so as to command, on a first output of the cell, the appearance of a current delivered by the current source as a function of the digital signal applied to the said cell and of the said at least one command signal, characterized in that it furthermore includes means for detecting the presence of a bit complementary to the bit of the digital signal and means for detecting the complement of the said at least one command signal, so as to command on a second output of the cell the appearance of a current delivered by the current source which is the complement of the current delivered on the first output, the said means for detecting the presence of bits and of the said at least one command signal, the said means for detecting the presence of complementary bits and of complementary command signals and the said current source being embodied with the aid of field-effect transistors of the same type.

SUMMARY OF THE INVENTION

According to other characteristics of the invention:

the current cell defined above being intended to enter into the construction of a switched current network formed of rows and columns of the said cells, the said means for detecting at least one command signal comprise means for detecting the status of the cell and means for detecting the status of a row of cells to which the said cell belongs, whilst the means for detecting the complement of the said at least one command signal comprise means of detecting the complement of the status of the said cell and means of detecting the complement of the status of the row of cells to which the said cell belongs, the said means of detecting the presence of a digital signal bit and the means of detecting the said at least one command signal form, with the means of detecting the presence of the said complementary bit and the means of detecting the said complement of the said at least one command signal, a setup which is symmetric with respect to the current source, the current source includes a transistor whose source-drain path is connected to the sources of a first and of a second transistor for detecting the status of the cell and to the sources of a first and second transistor for detecting the complement of the status of the said cell, the source-drain path of the first transistor for detecting the status of the cell is connected to the current source in series with the source-drain path of the transistor for detecting the presence of a digital signal bit, whilst the source-drain path of the first transistor for detecting the complement of the status of the cell is connected to the current source in series with the source-drain path of the transistor for detecting the status of the row of cells to which the said cell belongs, the drains of the said transistors for detecting the presence of a digital signal bit and for detecting the status of the row to which the cell belongs being connected to the first common output, the source-drain path of the second transistor for detecting the status of the cell is connected to the current source in series with the source-drain path of the transistor for detecting the presence of the complement of the digital signal bit, whilst the source-drain path of the second transistor for detecting the complement of the status of the cell is connected to the current source in series with the source-drain path of the transistor for detecting the complement of the status of the row of cells to which the said cell belongs, the drains of the said transistors for detecting the presence of the complement of the digital signal bit and for detecting the complement of the status of the row to which the cell belongs being connected to the second common output, the current source includes a transistor whose source-drain path is connected to the sources of a transistor for detecting the presence of a digital signal bit, of a first transistor for detecting the complementary signal of the status of the cell and of a transistor for detecting the presence of the complementary signal of the digital signal bit, a second transistor for detecting the presence of the complementary signal of the status of the cell having its source-drain path connected to the drains of the transistor for detecting the presence of a digital signal bit and of the transistor for detecting the presence of the complementary signal of the digital signal bit being connected to the current source in series with the source-drain path of a first transistor for detecting the status of the cell, the source-drain path of the first transistor for detecting the complementary signal of the status of the cell being connected to the current source in series with the source-drain path of a transistor for detecting the status of the row of cells to which the said cell belongs, and with the source-drain path of a transistor for detecting the complementary signal of the status of the said row of cells, the source-drain path of the transistor for detecting the complementary signal, the source-drain path of the transistor for detecting the presence of a digital signal bit being connected to the current source in series with the source-drain path of a second transistor for detecting the status of the cell, the drains of the first and second transistors for detecting the status of the cell being respectively connected with the drain of the transistor for detecting the status of the row of cells and with the drain of the transistor for detecting the complementary signal of the status of the row of cells to the first and second outputs of the cell.

A further subject of the invention is a switched current network, characterized in that it is formed of current bit cells of the type defined above, laid out in rows and columns, the first and second outputs of the said cells being respectively connected together and in that the said cells of the network are laid out around the centre of the network divided into four quadrants in such a way as to be commanded in accordance with a sequence in which command of a cell situated in a quadrant is followed by command of a cell situated in a quadrant symmetric with the previous quadrant with respect to the centre of the network.

BRIEF DESCRIPTION OF THE DRAWINGS

The invention will be understood more clearly on reading the following description, given solely by way of example and made with reference to the appended drawings, in which.

DETAILED DESCRIPTION OF THE INVENTION

Figure 1:
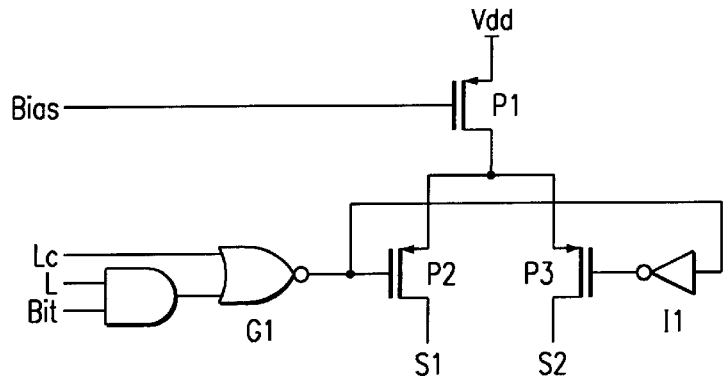
FIG. 1 represents the circuit diagram of a known current bit cell.

One known way of carrying out the decoding is that of using the current bit cell represented in FIG. 1.

This current bit cell includes a decoding part with a complex gate G1 and an invertor I1 in CMOS technology, employing four N-channel transistors and four P-channel transistors, and the current bit cell proper comprising a current source P1 and two switches P2 and P3, formed by three P-channel transistors, which makes eleven transistors in total.

Figure 2:
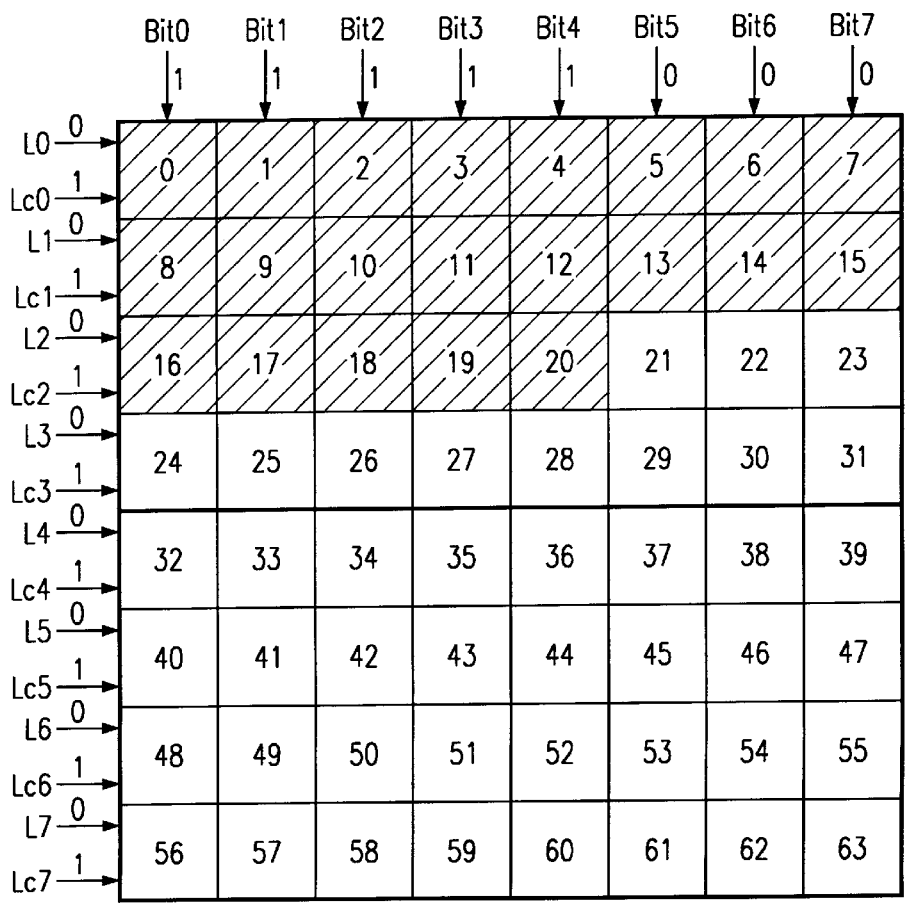
FIG. 2 is a decoding scheme for a network of current bit cells of the type represented in FIG. 1.

By using this type of cell, a network can be produced as an array of Y rows and X columns, and the decoding scheme represented in FIG. 2 is then as follows.

All the current bit cells of a single row are connected to the same row-decoding signal L and to a full row-decoding signal Lc, while all the rows of current bits in a single column are connected to a column decoding signal Bit.

A current bit cell such as the one in FIG. 1 is defined as active when the current flows through the output S1.

By using this decoding scheme, each individual current bit cell can be activated when its row (signal L) and its column (signal Bit) are active, whereas all the current bit cells of a row are activated when the entire row (signal Lc) is active.

This makes it possible to employ a technique of adding an element to each step of a digital code, by starting with activation of the first current bit cell of the first row with the first code, by adding a bit of the same column for the following code, and so on.

When the row being filled is complete, its signal Lc becomes active and the filling of the following row starts with its first current bit cell.

Figure 3:
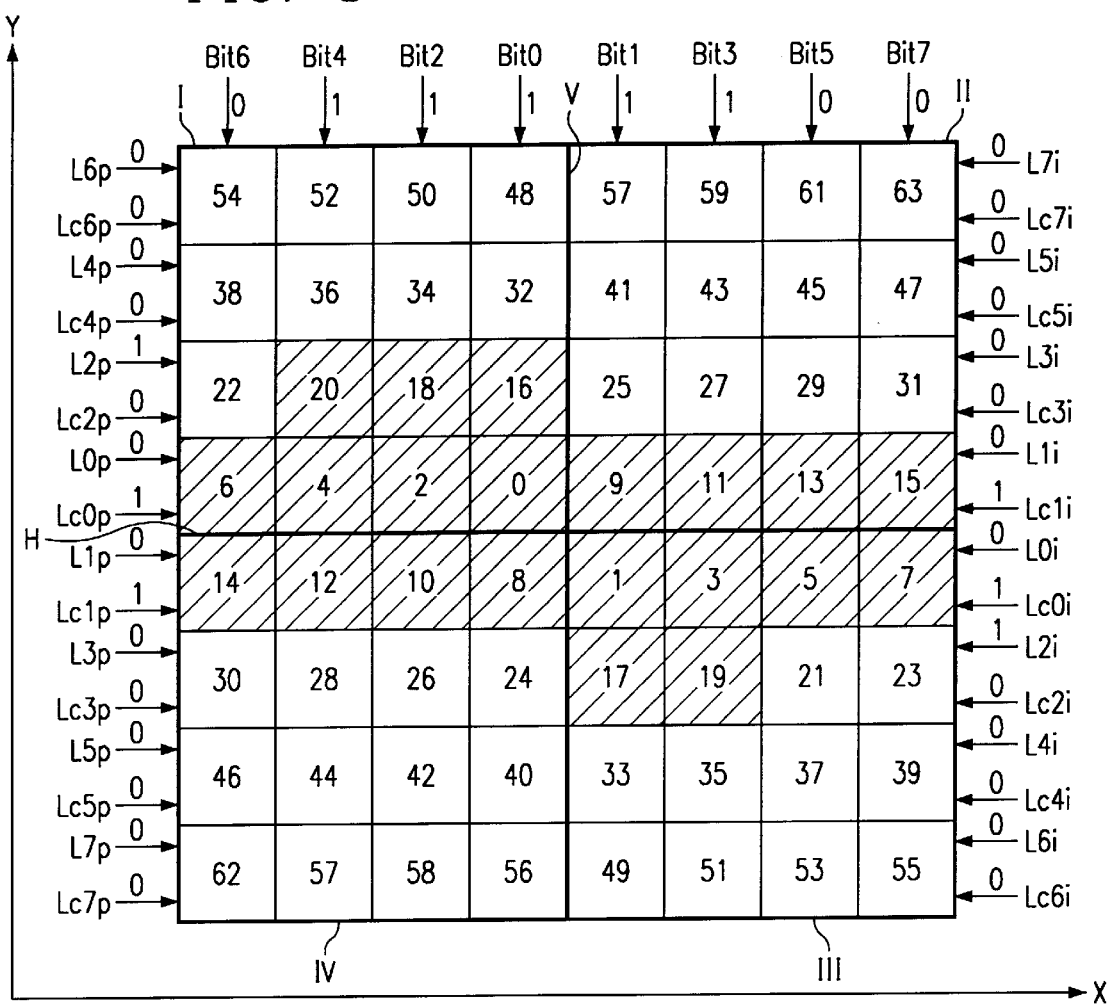
FIG. 3 is a decoding scheme for a network with pseudo-centroid topology.

By rearranging the topology of the network in the manner represented in FIG. 3, a pseudo-centroid topology can be obtained, in which the successive activated current bit cells are laid out quasi-symmetrically with respect of the centre of the network.

Figure 4:
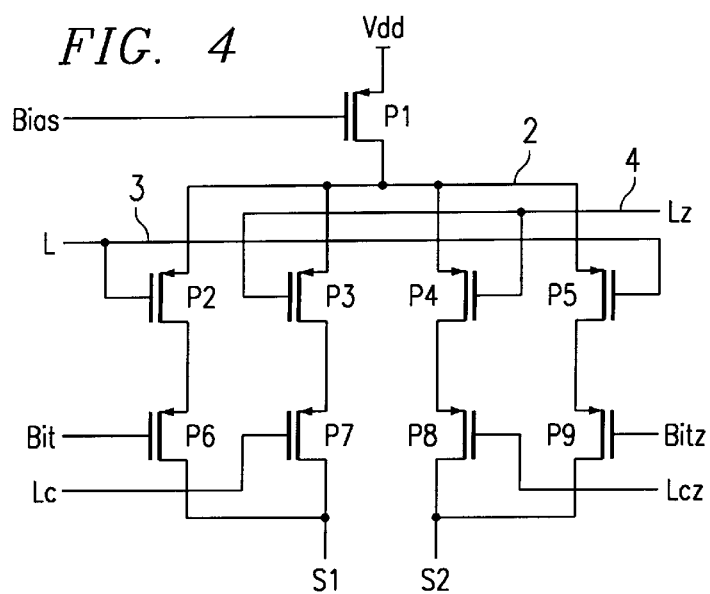
FIG. 4 is a circuit diagram of a current bit cell according to the invention.
Figure 5:
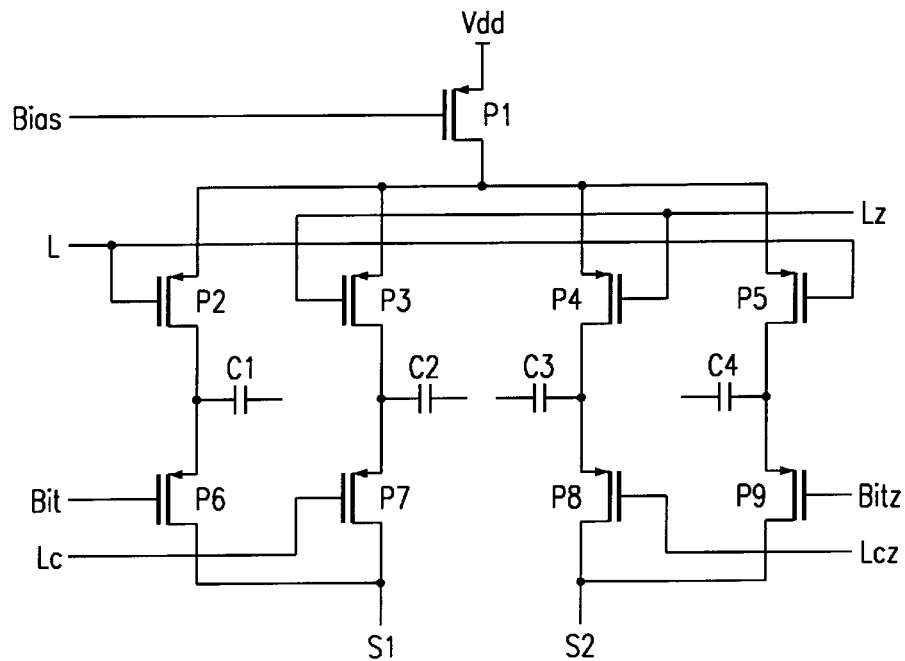
FIG. 5 is a circuit diagram, similar to the one in FIG. 4, showing the stray capacitances at certain points of the circuit.
Figure 6:
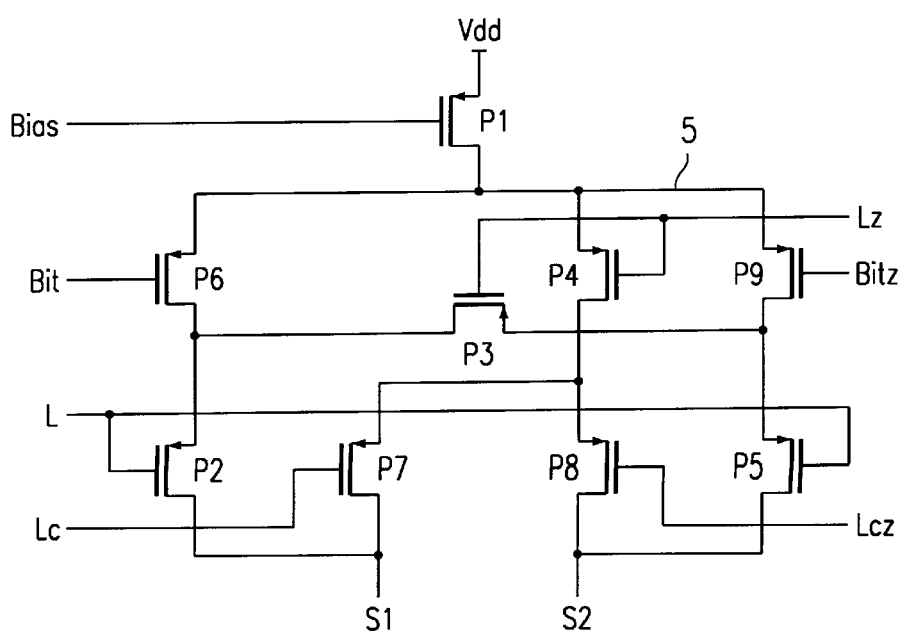
FIG. 6 is a circuit diagram of a current bit cell according to the invention, improved in order to avoid the stray capacitances.

This network, implementation of which is particularly suited to the use of cells according to the invention, such as the cells described with reference to FIGS. 4 to 6, is organised in the form of a network of Y rows and X columns.

According to the invention, it is divided into four quadrants I, II, III, IV, and the numbering of its cells from 0 to 63 expresses their order of command according to a sequence in which the commanding of a cell, such that the cell No. 0 located in a quadrant I of the network is followed by the commanding of a cell such as the cell No. 1 located in a quadrant III which is symmetrical to the previous quadrant with respect to the centre of the network manifested by the intersection of the lines V and H separating the network into four quadrants.

In FIG. 3, the activated cells corresponding to an input code detected by the network are represented in grey.

The digital signals Bit 0 to Bit 7 are applied in turn to cells located on either side of the vertical line V separating the network into two superposed equal parts.

The cell status signals L and the row status signals Lc are applied in turn to cells located on either side of the horizontal line H separating the network into two Juxtaposed equal parts.

The signals L, Lc applied to the even and odd cells are respectively suffixed p and i.

In the network, the signals S1 of all the current bit cells are connected together, and the signals S2 of all the current bit cells are connected together. This leads to provision at the output S2 of the complement of the current at the output S1 with respect to the total current flowing in the network.

If only the current available at one of the outputs S1 or S2 is used, for the subsequent operation, the network will be referred to as unipolar.

If the difference in current available on S1 and S2 is used for the subsequent operation, the network will be referred to as differential.

However, implementation of a current bit cell as represented in FIG. 1 raises a number of drawbacks.

It requires the use of N-type and P-type transistors, which, as indicated above, means that the packing density of the cell cannot be optimised because of the need for two different types of substrates.

A second drawback is the asymmetric structure, one switch being controlled by the complex gate G1 and the second switch being controlled by the invertor I1, which makes the cell unsuitable for differential networks.

In particular, the delay between the commanding of the two switches due to the invertor I1 introduces an electrical asymmetry between the two outputs, which negates some of the advantages of the differential circuit.

The proposed solution is represented in FIG. 4. The proposed current bit cell comprises a current source Pi and a set of eight switches P2 to P9 controlled by logic bit signals Bit, Bitz, L, Lz, Lc and Lcz.

The suffix z indicates the complement. For example, the signal Bitz is the complement of the signal Bit.

There are therefore in total nine field-effect transistors.

It will be noted that the current source may use more than one transistor in the case of a current source produced in cascode in order to improve the precision of the current.

The current bit cell represented in FIG. 4 includes a current source Pi formed by a P-channel transistor whose source is connected to a voltage Vdd, whose gate receives a Bias signal and whose drain is connected to a line connecting the sources of four P-channel transistors P2, P3, P4 and P5.

The gates of the transistors P2 and P5 are connected to an L signal line 3.

The gates of the transistors P3 and P4 are connected to an Lz signal line 4.

The drains of the transistors P2, P3, P4 and P5 are connected respectively to the sources of the corresponding P-channel transistors P6, P7, P8 and P9.

The gate of the transistor P6 receives the signal Bit, the gate of the transistor P7 receives the signal Lc, the gate of the transistor P8 receives the signal Lcz and the gate of the transistor P9 receives the signal Bitz.

The drains of the transistors P6 and P7 are connected to a common output terminal S1, whereas the drains of the transistors P8 and P9 are connected to a common output terminal S2.

As in the description above, the current bit cells in which the current is switched to the output S2 will be defined as being active.

This current bit cell allows the same decoding scheme as the cell in FIG. 1, that is to say that each individual cell can be activated, when the signals Bit are active, by means of the transistors P2 and P6, while the current bit cells of each entire row can be activated, when the signal Lc is active, by means of the transistors P3 and P7.

For the inactive current bit cells, the current is diverted to the output S2 when the signals Bit and L are inactive or when the entire row is inactive (Lc inactive).

One advantage of this current bit cell over the one represented in FIG. 1 resides in the fact that it uses only nine transistors instead of eleven, that all the transistors are of the same type (in the proposed solution, these are P-channel transistors, but the current bit cell may also be produced with ease using N-channel transistors). This makes it possible to obtain a higher packing density, and consequently to use smaller silicon surfaces.

The second advantage of the arrangement of the invention resides in the fact that this structure is symmetrical from a topological point of view and symmetrical from an electrical point of view with respect to the source, on condition that the command signals Bit, L and Lc are symmetrical (no delay and the same transition time) with regard to their respective complements Bitz, Lz and Lcz. This symmetry of the command signals can be obtained with ease by using suitable circuits.

Next, this topological and electrical symmetry of the current bit cell allows full benefit to be made of the advantages of the differential circuits.

However, an additional analysis of the current bit cell in FIG. 4 still shows minor imperfections which may lead to errors in the circuit current which are unacceptable in high-precision systems. These imperfections are due to the unavoidable presence of stray capacitances on the nodes between the switches connected in series.

FIG. 5 shows these capacitances C1, C2, C3 and C4 in a structure of the same type as the one represented in FIG. 4.

A first source of error results from the following phenomenon.

In the current bit cells activated by the command signal Lc (full row-decoding signal), the current originating from the source is switched to the output S1, the command signal L is inactive, turning the transistor P2 off and the signal Bit is toggled as a function of the decoding of the current bit cells of the row which is active or being filled. The coupling between the common node of the transistors P2 and P5 and the signal Bit leads to a stray charge on the capacitor C1 when the transistor P6 is switched off.

When the transistor P6 is turned on again, the stray charges on the capacitor C1 are removed through the output S1, leading to a transient error in the current at S1.

A second source of errors results from the following phenomenon.

In a current bit cell which is active or being filled, the command signal L is active (Lz is inactive) and the command signal Lc is inactive. This leads to the transistors P3 and P7 being switched off and makes the node common to P3 and P7 floating.

Because of the coupling, the capacitance C2 is charged with the stray charges which will be removed through the output S1 when the command signal Lc becomes active, also causing a transient error in the current at S1.

In order to overcome these drawbacks, an improved structure of current bit cells is represented in FIG. 6.

In this figure, the components entering into the construction of the circuit which have the same functions as those of the components of the circuit in FIG. 4, bear the same references.

Firstly, the circuit includes a current source consisting of the P-channel transistor P1, the source of which is connected to a voltage Vdd, the gate of which receives the signal Bias and the drain of which is connected to a line 5 connecting the sources of transistor P6, the gate of which is connected to the signal Bit, of the transistor P4, the gate of which is connected to the signal Lz, and of the transistor P9, the gate of which receives the signal Bitz.

The drain-source path of the P-channel transistor P3, the gate of which also receives the signal Lz, is connected between the drains of the transistors P6 and P9.

The drain of the transistor P6 is connected to the source of the transistor P2, the drain of the transistor P4 is connected to the source of the transistor P7 and to the source of the transistor P8, and the drain of the transistor P9 is connected to the source of the transistor P5.

The gates of the transistors P2 and P5 receive the signal L, while the gate of the transistor P7 receives the signal Lc and the gate of the transistor P8 receives the signal Lcz.

The drains of the transistors P2 and P7 are connected to the output S1, while the drains of the transistors P5 and P8 are connected to the output S2.

This structure avoids a node being left floating for any decoding status of the current bit cell. To this end, the position of the switches controlled by the signals Bit in the case of the transistor P6, and L in the case of the transistor P2, have been exchanged and the switch P3 has been placed between the common node of the transistors P2, P6 and P5, P9. With this structure, when the signal L is inactive, there is a path from the common node of P2, P6 and P5, P9 to S1 or S2, avoiding a floating status on the node P2, P6 or P5, P9.

The switches P7 and P8 respectively controlled by the signals Lc and Lcz are connected to a single switch P2, controlled by the signal Lz.

This configuration makes the floating status impossible at the node common to the transistors P4, P7 and P8, since a path from this node to the terminals S1 or S2 exists for any existing combinations of the signals Bit, L and Lc, as well as for the signals Bitz, Lz and Lcz.

Because, in most applications, the voltages at the nodes S1 and S2 are kept equal and constant, all the nodes of the current bit cell are always at the same voltage, and no stray capacitive charge produces error in the current at the outputs S1 or S2.

This novel structure also uses only nine transistors, all of the same type, and conserves a topological and electrical symmetry.

What is claimed is:

1. A current bit cell comprising a current source (P1), means (P6) for detecting the presence of a digital signal bit (Bit) and means (P2, P5, P7) for detecting at least one command signal (L, Lc) so as to command, on a first output (S1) of the cell, the appearance of a current delivered by the current source (Pi) as a function of the digital signal (Bit) applied to the said cell and of the said at least one command signal (L, Lc), means (P9) for detecting the presence of a bit (Bitz) complementary to the bit of the digital signal (Bit) and means (P3, P4, P8) for detecting the complement (Lz, Lcz) of the said at least one command signal (L, Lc), so as to command on a second output (S2) of the cell the appearance of a current delivered by the current source (P1) which is the complement of the current delivered on the first output (S1), the said means for detecting the presence of bits and of the said at least one command signal, the said means for detecting the presence of complementary bits and of complementary command signals and the said current source being embodied with the aid of field-effect transistors of the same type.

2. The current bit cell according to claim 1, intended to enter into the construction of a switched current network formed of rows and columns of the said cells, the said means for detecting at least one command signal comprises means (P2, P5) for detecting the status (L) of the cell and means (P7) for detecting the status (Lc) of a row of cells to which the said cell belongs, the means for detecting the complement of the said at least one command signal comprises means (P3, P4) of detecting the complement (Lz) of the status of the said cell and means (P8) of detecting the complement (Lcz) of the status of the row of cells to which the said cell belongs.

3. The current bit cell according to claim 1 wherein the said means (P6) of detecting the presence of a digital signal bit and the means (P2, P5, P7) of detecting the said at least one command signal (L, Lc) form, with the means (P9) of detecting the presence of the said complementary bit and the means (P3, P4, P8) of detecting the said complement (Lz, Lzc) of the said at least one command signal, a setup which is symmetric with respect to the current source (P1).

4. The current bit cell according to claim 2 wherein the current source includes a transistor (P1) whose source-drain path is connected to the sources of a first and of a second transistor (P2, P5) for detecting the status (L) of the cell and to the sources of a first and second transistor (P3, P4) for detecting the complement (Lz) of the status of the said cell.

5. The current bit cell according to claim 4, wherein the source-drain path of the first transistor (P2) for detecting the status (L) of the cell is connected to the current source (P1) in series with the source-drain path of the transistor (P6) for detecting the presence of a digital signal bit (Bit), whilst the source-drain path of the first transistor (P3) for detecting the complement (Lz) of the status of the cell is connected to the current source (P1) in series with the source-drain path of the transistor (P7) for detecting the status (Lc) of the row of cells to which the said cell belongs, the drains of the said transistors (P6, P7) for detecting the presence of a digital signal bit and for detecting the status (Lc) of the row to which the cell belongs being connected to the first common output (S1).

6. The current bit cell according to claim 4, wherein the source-drain path of the second transistor (P5) for detecting the status (L) of the cell is connected to the current source (P1) in series with the source-drain path of the transistor (P9) for detecting the presence of the complement (Bitz) of the digital signal bit, whilst the source-drain path of the second transistor (P4) for detecting the complement (Lz) of the status of the cell is connected to the current source (P1) in series with the source-drain path of the transistor (P8) for detecting the complement (Lcz) of the status of the row of cells to which the said cell belongs, the drains of the said transistors (P8, P9) for detecting the presence of the complement (Bitz) of the digital signal bit and for detecting the complement (Lcz) of the status of the row to which the cell belongs being connected to the second common output (S2).

7. The current bit cell according to claim 2 wherein the current source includes a transistor (P1) whose source-drain path is connected to the sources of a transistor (P6) for detecting the presence of a digital signal bit (Bit), of a first transistor (P4) for detecting the complementary signal (Lz) of the status of the cell and of a transistor (P9) for detecting the presence of the complementary signal (Bitz) of the digital signal bit, a second transistor (P3) for detecting the presence of the complementary signal (Lz) of the status of the cell having its source-drain path connected to the drains of the transistor (P6) for detecting the presence of a digital signal bit (Bit) and of the transistor (P9) for detecting the presence of the complementary signal (Bitz), the source-drain path of the transistor (P6) for detecting the presence of a digital signal bit being connected to the current source (P1) in series with the source-drain path of a first transistor (P2) for detecting the status (L) of the cell, the source-drain path of the first transistor (P4) for detecting the complementary signal (Lz) of the status of the cell being connected to the current source (P1) in series with the source-drain path of a transistor (P7) for detecting the status (Lc) of the row of cells to which the said cell belongs, and with the source-drain path of a transistor (P8) for detecting the complementary signal (Lcz) of the status of the said row of cells, the source-drain path of the transistor (P9) for detecting the complementary signal (Bitz) of the digital signal bit being connected to the current source (P1) in series with the source-drain path of a second transistor (P5) for detecting the status (L) of the cell, the drains of the first and second transistors (P2, P5) for detecting the status (L) of the cell being respectively connected with the drain of the transistor (P7) for detecting the status (Lc) of the row of cells and with the drain of the transistor (P8) for detecting the complementary signal (Lcz) of the status of the row of cells to the first and second outputs (S1, S2) of the cell.

8. Switched current network, wherein said network is formed of current bit cells according to claim 1, laid out in rows and columns, the first and second outputs of the said cells being respectively connected together and in that the said cells of the network are laid out around the centre of the network divided into four quadrants in such a way as to be commanded in accordance with a sequence in which command of a cell situated in a quadrant is followed by command of a cell situated in a quadrant symmetric with the previous quadrant with respect to the centre of the network.

9. A current bit cell comprising a current source (P1), a first transistor (P6) detecting the presence of a digital signal bit (Bit) and a first plurality of transistors (P2, P5, P7) detecting at least one command signal (L, Lc) so as to command, on a first output (S1) of the cell, the appearance of a current delivered by the current source (P1) as a function of the digital signal (Bit) applied to the said cell and of the said at least one command signal (L, Lc), a second transistor (P9) detecting the presence of a bit (Bitz) complementary to the bit of the digital signal (Bit) and a second plurality of transistors (P3, P4, P8) for detecting the complement (Lz, Lcz) of said at least one command signal (L, Lc), so as to command on a second output (S2) of the cell the appearance of a current delivered by the current source (P1) which is the complement of the current delivered on the first output (S1), said second transistor (P9) detecting the presence of bits and of the said at least one command signal, said second plurality of transistors (P3, P4, P8) detecting the presence of complementary bits and of complementary command signals and the said current source being embodied with the aid of field-effect transistors of the same type.

10. The current bit cell according to claim 9, intended to enter into the construction of a switched current network formed of rows and columns of the said cells, wherein the said first plurality of transistors comprise third and fourth transistors (P2, P5) for detecting the status (L) of the cell and a fifth transistor (P7) for detecting the status (Lc) of a row of cells to which the said cell belongs, said second plurality of transistors comprise sixth and seventh transistors (P3, P4) detecting the complement (Lz) of the status of the said cell and eight transistor (P8) detecting the complement (Lcz) of the status of the row of cells to which the said cell belongs.

* * * * *